United States Patent [19]
Cline et al.

[11] Patent Number: 5,514,962
[45] Date of Patent: May 7, 1996

[54] OBLIQUE MR IMAGE CONTROLLED FROM A 3D WORKSTATION MODEL

[75] Inventors: Harvey E. Cline, Schenectady; William E. Lorensen, Ballston Lake; Christopher J. Hardy, Schenectady, all of N.Y.

[73] Assignee: General Electric Company, Schenectady, N.Y.

[21] Appl. No.: 203,079

[22] Filed: Feb. 28, 1994

[51] Int. Cl.⁶ .................................................. G01V 03/00
[52] U.S. Cl. ........................................ 324/309; 324/307
[58] Field of Search ................................. 324/300, 307, 324/309, 310, 311, 312, 313, 314, 318, 322; 364/518

[56] References Cited

U.S. PATENT DOCUMENTS

| | | | |
|---|---|---|---|
| 4,674,046 | 6/1987 | Ozeki | 324/312 X |
| 4,737,921 | 4/1988 | Goldwasser et al. | 364/518 |
| 5,349,296 | 9/1994 | Kotte et al. | 324/309 |

OTHER PUBLICATIONS

Paper entitled "Interactive Image–Plane Acquisition in a Superconducting Open Magnet MR Scanner" by J. F. Schenck, K. G. Vosburgh, P. B. Roemer, H. E. Cline, W. E. Lorensen, C. J. Hardy, R. N. Newman, F. A. Jolesz, soon to be published.

*Primary Examiner*—Gerard R. Strecker
*Assistant Examiner*—Mack Haynes
*Attorney, Agent, or Firm*—Lawrence P. Zale; Marvin Snyder

[57] ABSTRACT

Three-dimensional (3D) image data is acquired from a subject with a medical imaging device and stored. The stored 3D image data is processed by a model workstation to segment the model into discrete structures and produce a segmented computer graphic model. An operator interacts with the model workstation to cause it to display desired structures of the the segmented model in a desired view and orientation. The operator also selects a position and orientation of a cutting plane passing through the segmented model. Once selected, the position and orientation information is provided to a pulse sequencer of a magnetic resonance (MR) imaging system. The pulse sequencer controls an RF transmitter and gradient amplifiers to cause an MR image of the subject at an imaging plane, corresponding to the cutting plane of the model workstation, to be acquired. This allows fast, accurate image plane selection, which may be selected by an operator who is simultaneously performing a medical procedure on the subject, aid in the procedure.

7 Claims, 2 Drawing Sheets

OBLIQUE MR IMAGE CONTROLLED FROM A 3D WORKSTATION MODEL

CROSS REFERENCE TO RELATED APPLICATIONS

This application is related to U.S. patent applications "MR Imaging System For Minimally Invasive Surgery" by Roemer et al.; "System for 3D Scan Conversion of a Polygonal Model Into a Point and Normal Format, Displayed Using an Accelerator Circuit" Ser. No. 07/812,264 filed Dec. 23, 1991; "System For Displaying Solid Cuts For Surfaces of Solid Models" by William E. Lorensen, Harvey E. Cline, Bruce Teeter, and Siegwalt Ludke, Ser. No. 07/812,394 filed Dec. 23, 1991; "Solid Models Generation By Span Method Using Dividing Cubes" by Harvey E. Cline, William E. Lorensen and Siegwalt Ludke, Ser. No. 07/812,479 filed Dec. 23, 1991 and "Apparatus and Method For Displaying Surgical Cuts in Three-Dimensional Models" by Harvey E. Cline, William E. Lorensen and Siegwalt Ludke, Ser. No. 07/812,395 filed Dec. 23, 1991, all assigned to the present assignee, and hereby incorporated by reference.

BACKGROUND OF THE INVENTION

1. Field of the Invention

The present application relates to magnetic resonance (MR) imaging system, and more specifically to MR Imaging system which allows interactive selection of imaging planes during imaging.

2. Description of Related Art

In conventional magnetic resonance (MR) Imaging systems, the three dimensional position of a desired region of the patient to be imaged must be provided to the MR imaging system before obtaining the image. In addition to the position, the three dimensional orientation must also be provided. Together these define an 'imaging plane'. These locations and orientations typically are provided to the system manually. Even though the computations may not be difficult, it makes it cumbersome to produce several images at different orientations.

With new open magnet MR imaging systems, such as (Atty. Docket No. RD-23,268) referenced above, it is possible to perform medical procedures on a subject and simultaneously acquire MR images. When a medical procedure, such as surgery, is being performed, it is very desirable to minimize the time required to calculate position and orientation of 'imaging planes' to acquire images.

Currently there is a need for an MR imaging system which provides MR images of selected internal structures of a patient undergoing a medical procedure in which an operator may easily indicate an imaging plane, and acquire an image of the subject from that plane.

SUMMARY OF THE INVENTION

An open magnetic resonance (MR) imaging system provides interactive images of a patient undergoing a medical procedure.

A three-dimensional (3D) data source provides a 3D data set of measurable parameters, or computer generated parameters of the subject at a number of three-dimensional (3D) locations within said subject which are stored in a 3D data storage device. A model workstation constructs a 3D model of said subject from the 3D data set, and displays the 3D model to the operator. The operator interactively manipulates the 3D model by selecting the surfaces to be displayed, the degree of transparency, viewing angle, scaling factor etc. with the aid of a pointing device. The operator also selects an oblique cut plane through the 3D model having a specific location and orientation which corresponds to a desired imaging plane in the subject.

A transformation device coupled to the model workstation receives the location and orientation of the oblique cut plane and calculates geometric transformation parameters required to modify a predetermined MR pulse sequence to acquire an image of said subject through the imaging plane which corresponds to the oblique cut plane. These transformation parameters are passed to the MR imaging device to result in an MR image of said subject at the desired imaging plane. This image is then displayed on the workstation display, either beside the 3D model, or superimposed upon the cut plane of the 3D model.

OBJECTS OF THE INVENTION

It is an object of the invention to provide a magnetic resonance (MR) imaging system which produces an image from an imaging plane of the subject interactively selected by an operator performing medical procedures on the subject.

Another object of the present invention is to provide interactive MR images to a physician to aid the physician in performing medical procedures.

Another object of the present invention is to allow a physician to interactively select a position and orientation of imaging planes for MR images.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

DETAILED DESCRIPTION OF THE INVENTION

Figure 1:
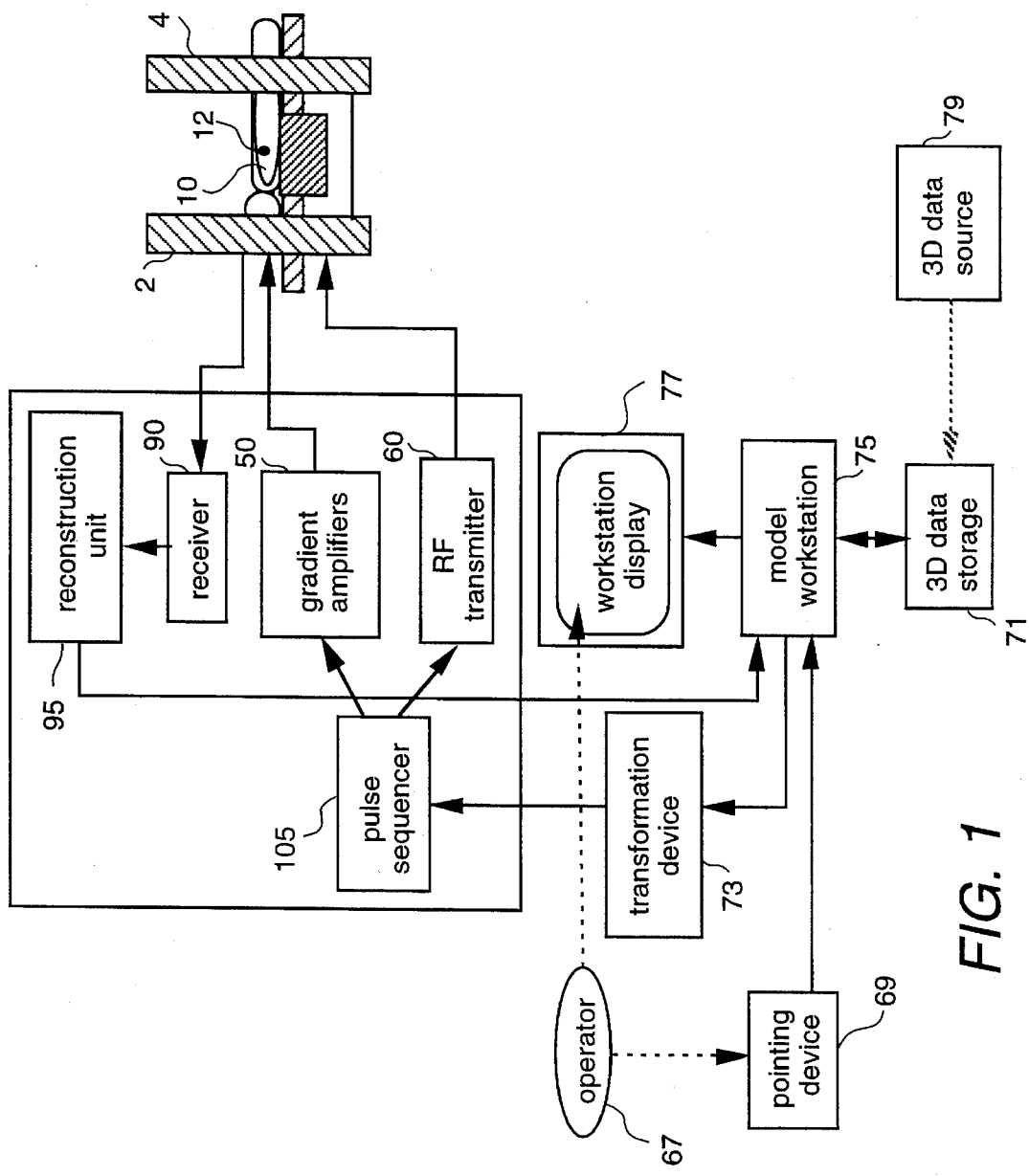
FIG. 1 is a block diagram of an embodiment of a magnetic resonance (MR) imaging system according to the present invention.

A block diagram of the magnetic resonance (MR) imaging system of the present invention is shown in FIG. 1. A patient 10, is possibly with an invasive an invasive device 12 inserted within patient 10, is positioned within an open main magnet, having two superconducting rings 2, 4, is arranged as a modified "Helmholtz pair" which provides a static, spatially homogeneous magnetic field over an imaging volume between the rings. The spacing between the rings is slightly different from that of a "Helmholtz pair" in order to elongate the imaging volume, and is therefore termed a "modified Helmholtz pair". A gradient amplifier 50 provides power to a plurality of gradient coil sets located within rings 2, 4, each producing a magnetic field gradient in a specified direction. An RF transmitter 60, supplies the necessary power to RF coils to nutate nuclear spins within a patient in the imaging volume. The gradient coil sets within rings 2, 4 produce magnetic field gradients over the imaging volume without restricting access to the imaging volume, or the patient within the imaging volume.

A three-dimensional (3D) data source 79 provides a 3D data set of physical parameters of a subject over a three-dimensional as (3D) region. The 3D data set may be measured values such as those from a computed axial tomography (CAT) device, or a magnetic resonance (MR) imaging device, or may be from a computer graphic modeling device which may synthesize a 3D data set from parameters provided to it. Data source 79 stores the 3D data set in a 3D data storage device 71 for further use.

In one embodiment, the 3D data Set may be acquired from the MR imaging portion of the device of FIG. 1 and prestored.

A Model workstation 75, coupled to 3D data storage device 71 processes the 3D data set and converts it to a computer model capable of being manipulated and displayed in near-real-time. Surfaces are defined between 3D data set values indicating an interface between different types of materials. This may indicate different types of tissue in a subject. Connectivity of similar types of materials adjacent to one another is then determined. This is known as segmentation. When the 3D data set has been segmented into internal structures, each internal structure may be treated as a separate solid object by model workstation 75.

Operator 67 interacts with model workstation 75, through pointing device 69, to selectively display desired surfaces, color code structures, sever, rotate and translate internal structures in a desired manner to provide an image to operator 67 on workstation display 77. A more detailed description is provided in the aforementioned Ser. No. 07./812,394, "System for Displaying Solid Cuts For Surfaces of Solid Models" Lorensen et al.

If the 3D data set was originally acquired from a graphic modeling device, then it may be displayed and manipulated by a graphics workstation as described in the aforementioned Ser. No. 07/812,264 "System for 3D Scan Conversion of a Polygonal Model Into a Point and Normal Format, Displayed Using an Accelerator Circuit".

Operator 67, through pointing device 69, which may be a mouse, trackball etc., selects a location and orientation of a cut plane through the model displayed on workstation display 77. The plane of the patient in which the image is acquired is known as the "imaging plane". This location and orientation is provided to a transformation device 73 which calculates geometric transformation parameters.

The transformation parameters are provided to a pulse sequencer 105 which modifies the pulse shapes, amplitudes, and/or timing offsets of a predetermined MR pulse sequence, which may be a conventional MR pulse sequence, to cause an MR image to be acquired from an oblique plane corresponding to the cut plane provided by operator 67. Conventional methods of pulse sequence modification may be used to cause an image to be obtained from the prescribed oblique cut plane.

Pulse sequencer 105 controls the timing and activation of gradient amplifier 50 and RF transmitter 60 to produce magnetic field gradients and RF radiation Which cause an MR response signal to be emitted by tissue of patient 10 in the imaging plane.

A receiver 90 receives the emitted MR response signal from the imaging plane of patient 10, and provides this signal to a reconstruction unit 95. Reconstruction unit 95 produces data for an MR image of patient 10 at the imaging plane. The image data is provided to model workstation 75 which displays an MR image on workstation display 77 to aid the physician during medical procedures such as surgery.

Workstation display 77 may be located near the physician. Due to the large magnetic fields the display device Would have to be a liquid crystal display. Also since there is substantial RF radiation, it should be enclosed in a suitable RF shielding to minimize RF interference.

Another method of displaying images to the physician is by employing a projection television located outside the magnet room with images projected onto a screen located within the viewing area of the physician.

Figure 2:
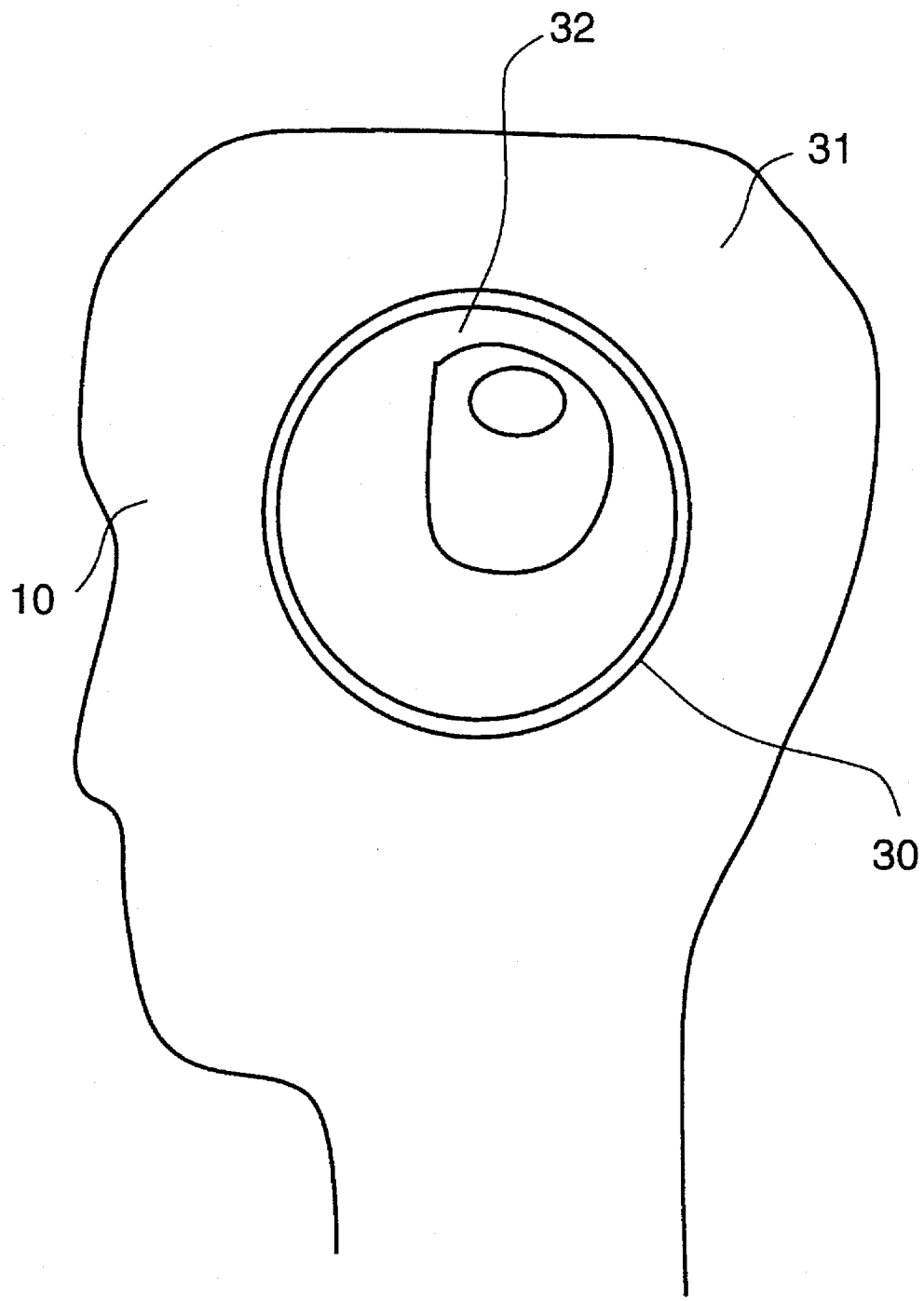
FIG. 2 is an image of a computer model of the head of a subject with a cut planes selected to be the plane of the workstation display.

FIG. 2 is an image of a computer model of the head of subject 10 with a cut planes selected to be the plane of the workstation display 77. The cut plane intersects the subject's head on the left side with a substantially circular intersection 30. Outside of the circular intersection, the external structures of patient 10 are visible. However, inside circular intersection 30, reveals internal structures of subject 10. If an image is desired with this location and orientation of the cut plane, operator 67 of FIG. 1, would initiate an image. The location and orientation of the cut plane would be sent to transformation device 73, and the transformed parameters will be sent to pulse sequencer 105 causing the RF transmitter 60 and gradient amplifiers 50 to cause an MR response signal to be emitted by an image plane corresponding to the cut plane, all of FIG. 1. Receiver 90 would sense the MR response signal and pass it to reconstruction unit 95 to reconstruct an image. The image is then passed to model workstation 75 which displays the MR image on workstation display 77. The MR image may be scaled and manipulated to match the image of the model view and superimposed on the model image if desired.

While several presently preferred embodiments of the present novel invention have been described in detail herein, many modifications and variations will now become apparent to those skilled in the art. It is our intent therefore, to be limited only by the scope of the appending claims and not be the specific details and instrumentalities presented by way of explanation herein.

What we claim is:

1. A method of producing magnetic resonance (MR) images of a subject in an interactive fashion, comprising the steps of:

a) acquiring a throe-dimensional (3D) data set comprised of measurable data of the subject at a plurality of three-dimensional (3D) locations within said subject;

b) constructing a 3D model of said subject from the 3D data set;

c) displaying the 3D model on a workstation to an operator;

d) generating and displaying an oblique cut plane through the 3D model, whose location and orientation are controlled by the operator through a pointing device coupled to the workstation;

e) calculating the geometric transformation parameters required to acquire a new image of said subject of an imaging plane having the same location and orientation, relative to said patient as the oblique cut plane, relative to the 3D model;

f) passing the transformation parameters to an MR imaging device;

g) modifying a magnetic resonance (MR) pulse sequence by adjusting pulse shapes, amplitudes and timing offsets according to the calculated transformation parameters;

h) acquiring a new MR image of said subject at the imaging plane with the modified MR pulse sequence; and i) displaying the new MR image of the subject.

2. The method of producing magnetic resonance (MR) images of claim 1 wherein steps 'c' through 'i' are repeated a plurality of repetitions to interactively image a structure within said subject from a desired perspective.

3. The method of producing magnetic resonance (MR) images of claim 1 wherein steps 'c' through 'i' are repeated a plurality of repetitions to interactively image the placement of a medical device within said subject.

4. The method of producing magnetic resonance (MR) images of claim 1 wherein the MR image acquired in step 'h' is superimposed on the 3D model displayed on the workstation.

5. An interactive magnetic resonance (MR) imaging system allowing an operator to interactively select the location and orientation of MR images of a subject comprising:

a) a three-dimensional (3D) data storage device capable of storing information provided to it indexed by location;

b) a 3D data source for providing a 3D data set to the 3D data storage device, the 3D data set comprised of measurable data of the subject at a plurality of three-dimensional (3D) locations within said subject;

c) an MR imaging device capable of acquiring an image of a subject at an imaging plane specified by a location and orientation when the location and orientation are provide to it, and displaying that image;

d) a pointing device capable of receiving input from said operator;

e) a model workstation coupled to the pointing device, capable of constructing a 3D model of said subject from the 3D data set, displaying the 3D model to said operator according to the input received from the pointing device, generating and displaying an oblique cut plane through the 3D model with a location and orientation responsive to the pointing device;

f) a transformation device coupled to the model workstation for receiving the location and orientation of the oblique cut plane and for calculating the geometric transformation parameters required to acquire a new image of said subject through the imaging plane corresponding to the oblique cut plane, and passing the transformation parameters to the MR imaging device to result in a new MR image being acquired of said subject at the desired imaging plane.

6. An interactive magnetic resonance (MR) imaging system comprising:

a) an MR imaging device for acquiring MR images of a subject in a imaging plane;

b) workstation for constructing and displaying a computer generated three-dimensional (3D) model from a predetermined 3D data set of the subject, and to display the MR image from the MR imaging device;

c) pointing device coupled to the workstation capable of interacting with an operator to select a location and orientation of an oblique cut plane through the 3D model;

d) transformation device for calculating a geometric transformation required to transform a predetermined MR pulse sequence to cause the MR imaging device to acquire an MR image in an imaging plane through said subject corresponding to the oblique cut plane and be displayed on the workstation.

7. The invention of claim 6 wherein the pointing device, is one of the group consisting of a: mouse, trackball, lightpen and touch-sensitive screen.

* * * * *